United States Patent [19]

Epsztein et al.

[11] 4,074,213
[45] Feb. 14, 1978

[54] ELASTIC BULK WAVE FREQUENCY FILTER

[75] Inventors: Bernard Epsztein; Gérard Kantorowicz, both of Paris, France

[73] Assignee: Thomson-CSF, Paris, France

[21] Appl. No.: 746,127

[22] Filed: Nov. 30, 1976

[30] Foreign Application Priority Data

Dec. 5, 1975 France .................. 75 37317

[51] Int. Cl.² .............. H03H 9/26; H03H 9/30; H03H 9/32; H01L 41/04
[52] U.S. Cl. ........................... 333/71; 333/30 R; 333/72
[58] Field of Search ............... 333/71, 72, 30 R; 310/311, 318, 328, 329, 333, 334, 335, 345, 367

[56] References Cited

U.S. PATENT DOCUMENTS

| | | | |
|---|---|---|---|
| 3,283,264 | 11/1966 | Papadakis | 333/30 R X |
| 3,300,739 | 1/1967 | Mortley | 333/30 R |
| 3,522,557 | 8/1970 | Duncan et al. | 333/30 R |
| 3,562,676 | 2/1971 | Parker, Jr. | 333/30 R |

Primary Examiner—Alfred E. Smith
Assistant Examiner—Marvin Nussbaum
Attorney, Agent, or Firm—Roland Plottel

[57] ABSTRACT

A high frequency elastic bulk wave filter, using the variation as a function of frequency of the direction in which a bulk wave travelling through an elastic body is diffracted by a flat surface of that body, formed with a grating. The bulk wave beam corresponding to the signal to be filtered, impinges under normal incidence on the grating, the profile of which is designed to minimize the amount of energy contained in the non-dispersive beam specularly reflected by the grating. The filter further comprises a transducer to collect the diffracted wave, applied to an inclined surface, which is parallel to the wave plane of the diffracted wave.

9 Claims, 5 Drawing Figures

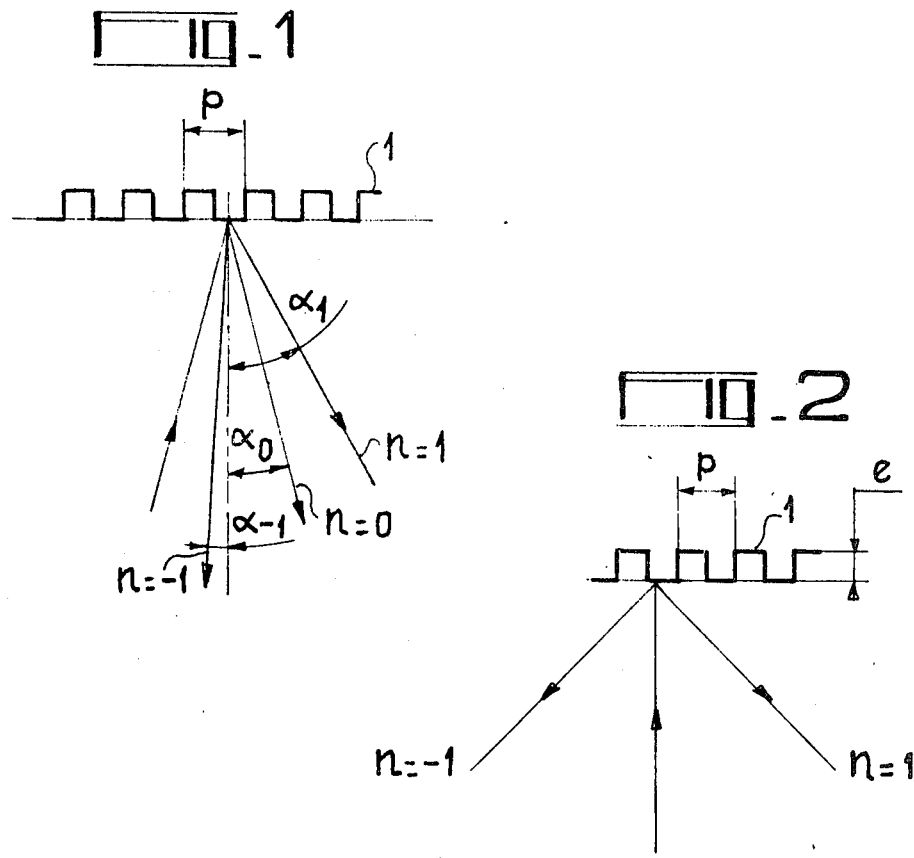

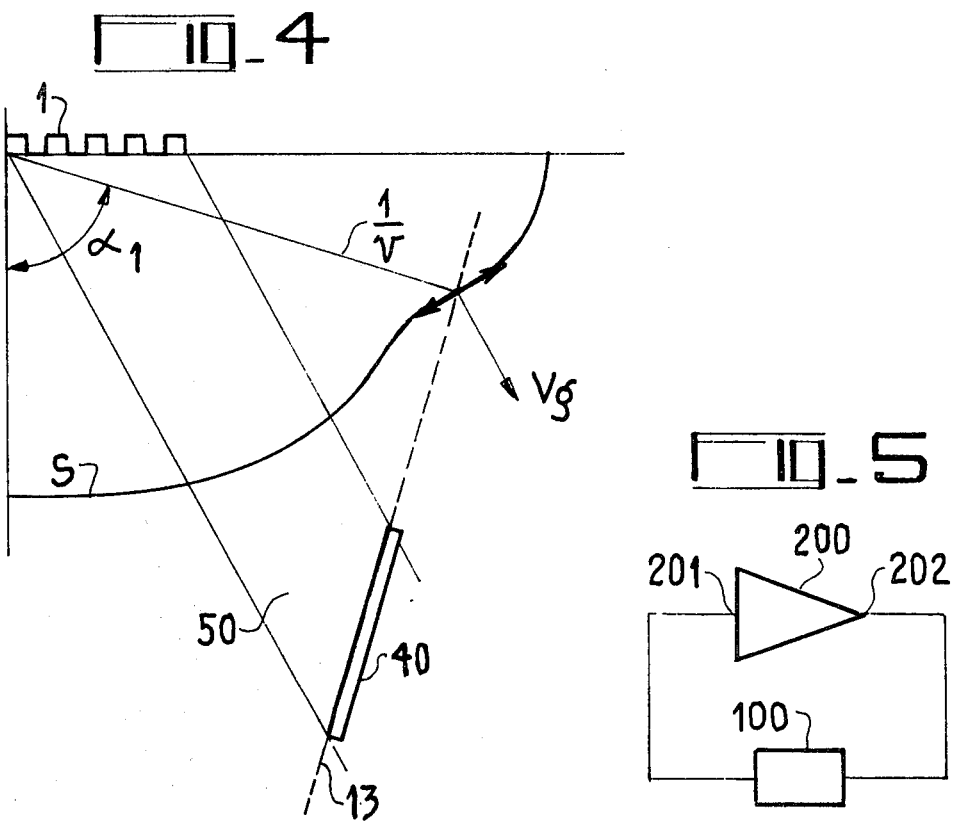
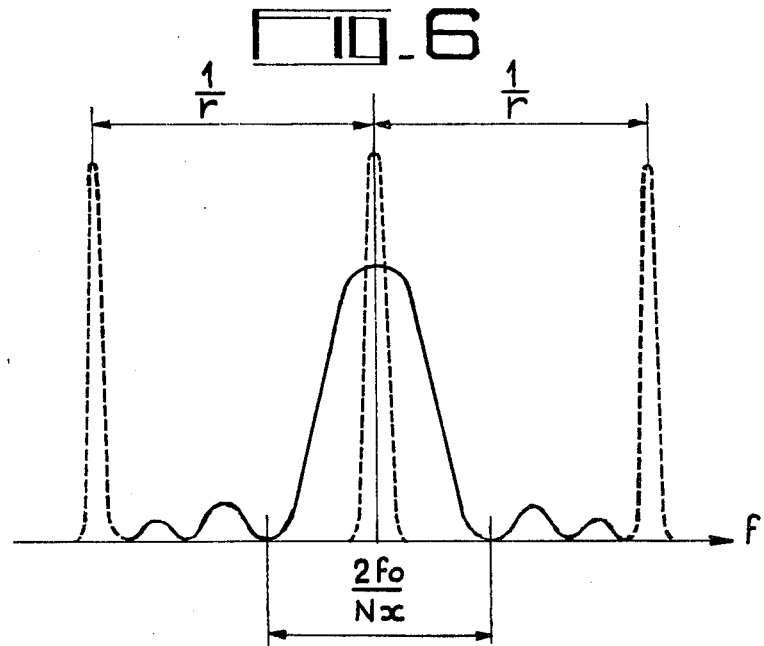

ELASTIC BULK WAVE FREQUENCY FILTER

This invention relates to an acoustic bulk wave filter for high frequency applications and to its use in the construction of oscillators, especially for hyperfrequencies.

The construction of any frequency filter is based on the variation as a function of frequency of the direction in which an acoustic (or elastic) bulk wave is diffracted by a periodic grating into several beams of unequal intensity.

An elastic bulk wave travelling through a body is specularly reflected at a flat surface delimiting this body, in accordance with a known law, in such a way that the incident beam and the reflected beam have the same wave number component ($k = 2 \pi/\lambda$) at the surface in question. If parallel periodic grooves of period $p$ have been machined into the surface, diffracted beams, in addition to the preceding specularly reflected beams, are emitted in preferential directions. For these diffracted beams, two waves coming from two points separated by one period ($p$) have a path difference equal to a whole number of wave-lengths. In cases where the reflected or diffracted wave has the same vibration mode as the incident wave, this is translated by the condition:

$$\sin \alpha_n = \sin \alpha + (n \cdot (\lambda/p)) \quad (1)$$

where $\alpha$ is the angle of the incident beam with the normal to the flat surface in question, $\alpha_n$ is the angle of the diffracted beam with that normal, $n$ is a positive or negative integer, $p$ is the period of the grooves that is to say the distance separating two homologous points of two adjacent grooves, and $\lambda$ is the wave-length of the incident wave. To $\lambda$ corresponds the frequency $f$, with $f = v/\lambda$, $v$ being the velocity of the elastic wave in the body in question. It can be seen from this formula that except where $n = 0$, corresponding to the specular reflection, the angle $\alpha_n$ is dependent upon the wave-length ($\lambda$) and thus the frequency ($f$) of the incident wave.

The invention makes use of this property for the construction of bulk wave frequency filters in elastic materials.

In accordance with the invention, there is provided a frequency filter for filtering a signal having a plurality of frequency components, comprising an elastic body having two parallel surfaces, the first of said surfaces bearing an input transducer to which said signal to be filtered is applied, said input transducer accordingly, in said body, generating a beam of elastic bulk waves corresponding to said signal, the second of said surfaces bearing a grating of parallel obstacles which diffracts said components of said beam in a plurality of diffracted beams, each having a direction which is governed by the frequency of said components, said obstacles having a shape and being arranged in such a way as to concentrate substantially all the energy in said diffracted beams, said body having a third surface which is inclined relative to said two parallel surfaces, an output transducer being applied on said third surface for intercepting one of said diffracted beams, said third surface being parallel to the wave planes of said intercepted diffracted beam for the central frequency of said signal to be filtered.

The invention will be better understood from the following description in conjunction with the accompanying drawings, where the same reference numerals have been used to denote the same components and in which:

FIG. 1 is a diagram relating to the diffraction phenomena;

FIG. 2 is a diagram similar to FIG. 1 in the case of one variant embodiment of the invention;

FIG. 3 is a diagrammatic view showing one embodiment of the filter according to the invention;

FIG. 4 is a diagram relating to certain variant embodiment of filters according to the invention;

FIGS. 5 and 6 are, respectively, a diagrammatic view and the corresponding frequency spectrum of an application of the invention.

FIG. 1 diagrammatically illustrates the diffraction phenomenon in the case of elastic bulk waves travelling through a body of which one flat surface carries a grating of obstacles. In this Figure, the grating is denoted by the reference 1; the incident beam is represented by the left-hand arrow, and $\alpha_o$, $\alpha_1$ and $\alpha_{-1}$ are the values of the angle $\alpha_n$ of formula (1) above, which the emergent beams form with the normal to said flat surface (broken line). The representation of the Figure is limited to the diffracted beams corresponding to the values $n = 1$ and $n = -1$; it also shows the specularly reflected beam, corresponding to $n = 0$.

Normally, most of the emergent energy is contained in that specularly reflected beams ($n = 0$) which, according to the foregoing, is not used in the present invention. Accordingly, there could be a danger of a significant insertion loss. However, it is known that this disadvantage may be obviated by suitably selecting the profile of the grooves of the grating. Various solutions to this problem have been proposed, cf. L. FORTUIN "Survey of literature on reflection and scattering of sound waves at the sea surface" JASA, 47, No. 5 (part 2), May 1970, pages 1209 and 1228 and J. M. PROUD, P. TAMARKIN, W. C. MEECHAM "Reflection of sound from a surface of saw-tooth profile" J.A.P. 28, No. 11, November, 1957, pages 1298-1301.

An other solution is shown in FIG. 2 where grooves are of rectangular cross-section, with a depth E substantially equal to $\lambda/4$, $\lambda$ representing the wave-length of the incident wave. In this device, the elementary sources of the diffracted wave are in phase opposition for a hollow and for the adjacent solid and the energy radiated in the direction corresponding to $n = 0$ is zero. By contrast, these sources radiate in phase for the order $n = 1$ (or $n = -1$).

One embodiment of the frequency filter according to the invention is shown by way of example in FIG. 3. A body 10 cut out of an elastic material comprises on one of its surfaces 11 a grating 1 of rectangular grooves. The grating 1 receives at the normal incidence a beam of waves emitted by a transducer 20, applied to the surface 12 of the body 10 opposite and parallel to the surface 11. In the example illustrated, the transducer 20 is a piezo-electric transducer in which acoustic waves are generated under the effect of an applied electrical voltage $V_e$. The diffracted beams of order 1 and $-1$, corresponding to the incident wave of frequency $f_o$, form with the normal to the surface 11, angles $\alpha_{\pm 1}$ given by the equation (1) for the particular value of $\lambda = \lambda_o$. These angles satisfy the relation:

$$1/\lambda_o \sin(\alpha_{\pm 1}) = \pm 1/p$$

The beam specularly reflected along the normal has negligible energy as a result of the profile selected for the grooves, shown in FIG. 2, of which the depth is substantially equal to $\lambda_o/4$. The load 30, on the left of the Figure, made of a material selected for this purpose, absorbs the diffracted beam corresponding to $n = -1$ to avoid the multiple reflections. The useful diffracted beam ($n = 1$) is collected in the piezoelectric transducer 40 at the terminals of which there appears an electrical voltage $V_s$ which reproduces the diffracted wave. The elements 30 and 40 are applied to surfaces 13 and 14 of the body 10 which are inclined relative to the surfaces 11 and 12. In the particular case of an isotropic body 10, these surfaces are perpendicular to the diffracted beam of frequency $f_o$ and their plane, which is coincident with the wave plane corresponding to the frequency $f_o$, is thus slightly inclined relative to the wave planes of the adjacent frequencies.

The structure functions as a filter for the incident signal in a given band around the frequency $f_o$ because, if for any frequency other than $f_o$ the wave plane does not coincide with the plane of the transducer 40, on the contrary, for frequencies sufficiently close to that frequency the inclination of the wave planes in question is sufficiently low for the signal picked up by the transducer 40 to have a non-negligible level at the frequencies in question. This is thus the case as long as the acoustic paths of the diffracted waves of the different frequencies between the grating and the two extreme points of the transducer 40 on the surface 13 differ by at least one wavelength $\lambda_o$. The transducer 40 thus picks up signals with non-negligible levels on the frequencies adjacent $f_o$, in a certain band around $f_o$.

The wave surface of the entire beam diffracted by the grating 1 at the frequencies adjacent the central frequency $f_o$ is not parallel to the plane of the transducer 40, in which the area of the surface applied to the surface 13 of the body 10 is greater than that reached by the only diffracted beam of frequency $f_o$, and of which all the points thus are not excited in phase. The voltage at the terminals of the piezoelectric transducer 40 varies with the difference $\Delta f$ between the frequency $f_o$ and the adjacent frequencies as follows:

$$\frac{\sin N \cdot \frac{\Delta f}{f_o}}{x \cdot \frac{\Delta f}{f_o}},$$

where $N$ is the total number of grooves of the grating and $x$ is a coefficient larger or smaller than 1, according to the direction of the group velocity of the beam of acoustic waves relative to the normal to the wave plane. This coefficient $x$ represents the anisotropy of a body 10 in which the velocity of propagation of the elastic waves depends upon their direction of propagation. The amplitude of the voltage at the terminals of the transducer 40 thus decreases about the frequency $f_o$ in a relative frequency band $2/Nx$ which is the pass band of the filter thus constructed.

Filters of this kind have the advantage of being compact.

They may be made of various materials such as, for example, lithium niobate $LiNbO_3$, quartz, etc.

In one preferred embodiment of the invention, the body 10 is made of an anisotropic material such as crystallised aluminium or corundum. The surfaces 11 and 12 (FIG. 3) are cut perpendicularly of the axis Z. The surface 13 is always directed along the wave plane, i.e. perpendicularly of the diffracted beam of frequency $f_o$, that is to say, in FIG. 4, perpendicular to the direction $\alpha_1$. However, the fact that this material is anisotropic means that, in order to intercept the beam from all the diffracted waves of the band $\Delta f$, the transducer 40 will have to be offset relative to the direction $\alpha_1$, as shown in FIG. 4. FIG. 4 gives, in polar co-ordinates (curve S), the inverse of the propagation velocity $(1/v)$ of the wave in the body 10 as a function of the diffraction angle $\alpha$ relative to the normal to the grating 1, because the diffracted energy on all frequencies of the band $\Delta f$ is contained in the beam 50, the direction of which is that of the group velocity, $V_g$ in FIG. 4, of the frequencies of this band. The result is that the surface 13 is no more perpendicular to the direction of the resulting propagation path (50) of the diffracted beam.

The advantage of corundum is that its losses at high frequencies are low.

The grooves of the grating 1 are produced by machining the body 10 by any known method, for example by photolithography. The grating of the devices according to the invention may also be formed by relief ribs obtained by the deposition of a material with the same acoustic impedance as the constituent material of the body 10 or with a similar impedance, such as chromium.

In the embodiment shown by way of example in FIG. 3, the grooves of the grating have a rectangular cross-section. However, it is possible in accordance with the invention to use grooves of any other shape, providing they enable virtually all the specularly reflected rays to be eliminated.

The filter according to the invention is particularly suitable for the construction of high-stability hyperfrequency radioelectric oscillators, as illustrated in FIG. 5.

If a fraction of the power extracted at the output 202 of an amplifier 200 (FIG. 5) is returned to its input 201 through a delay line 100 with a propagation time $r$ such that the loop has a gain equal to one, the structure as a whole will be able to oscillate at a certain number of frequencies $f_m$ determined by the following phase relation:

$$\phi_o + 2\pi f_m r = 2\pi m,$$

where $\phi_o$ is the phase shift introduced by the amplifier at the frequency $f_m$ and $m$ is an integer. The reference 100 denotes a filter according to the invention.

The greater the delay $r$, the more stable the frequency of the oscillator. Accordingly, this prompts the use of an acoustic delay line which gives long delays for small overall dimensions. Beyond 1 GHz, it will be easiest to use bulk waves for forming the delay line. At this frequency, and with a velocity of the wave in the crystal of the filter of 5000 m/s, the delay amounts to 2 $\mu$s/cm.

Together, the frequencies $f_m$ form a comb of frequencies separated by intervals of $1/r$. From this comb, the filter described above enables a single frequency to be filtered provided its band width is less than the difference between these frequencies. The filtering condition is as follows $$1/r > (2f_o/N.x)$$

This is illustrated by the frequency spectrum shown in FIG. 6, where three out of the comb of frequencies, separated by intervals of $1/r$, have been shown in dotted line, and the response of the system in full line, the pass band of the filter being centred on the middle frequency, for example.

Of course, the invention is not limited to the embodiments described and shown, which were given solely by way for example.

What is claimed is:

1. A frequency filter for filtering a signal having a plurality of frequency components, comprising an elastic body having two parallel surfaces, the first of said surfaces bearing an input transducer to which said signal to be filtered is applied, said input transducer accordingly, in said body, generating a beam of elastic bulk waves corresponding to said signal, the second of said surfaces bearing a grating of parallel obstacles with diffracts said components of said beam in a plurality of diffracted beams, each having a direction which is governed by the frequency of said components, said obstacles having a shape and being arranged in such a way as to concentrate substantially all the energy in said diffracted beams, said body having a third surface which is inclined relative to said two parallel surfaces, an output transducer being applied on said third surface for intercepting one of said diffracted beams, said third surface being parallel to the wave planes of said intercepted diffracted beam for the central frequency of said signal to be filtered.

2. A frequency filter as claimed in claim 1, wherein said grating is a grating of parallel grooves of rectangular cross-section, each of said grooves having a depth substantially equal to $\lambda o/4$, where $\lambda o$ is the wave-length of the central component of said elastic wave.

3. A frequency filter as claimed in claim 1, wherein said body is isotropic and said third surface is perpendicular to the direction of said intercepted diffracted beam.

4. A frequency filter as claimed in claim 1, wherein said input transducer is a piezoelectric transducer and said signal is a voltage.

5. A frequency filter as claimed in claim 1, wherein said output transducer is a piezoelectric transducer generating an output signal which is a voltage.

6. A frequency filter as claimed in claim 1, wherein said body is an anisotropic solid and said third surface is oblique relative to the direction of the resultant propagation path of said intercepted diffracted beam.

7. A frequency filter as claimed in claim 1, wherein said body is made of crystallised alumina.

8. A frequency filter as claimed in claim 7, wherein said parallel surfaces are perpendicular to the axis Z of the crystal.

9. A frequency filter as claimed in claim 1, further comprising an absorbing load on a fourth surface of said body, which is symmetrical with said third surface relative to the normal to said two parallel surfaces.

* * * * *